(12) United States Patent
Takamori

(10) Patent No.: US 7,663,366 B2
(45) Date of Patent: Feb. 16, 2010

(54) MAGNETIC RESONANCE IMAGING APPARATUS WITH A MOVABLE RF COIL HAVING A CONTROLLABLE DISTANCE BETWEEN THE MOVABLE RF COIL AND AN IMAGED BODY SURFACE

(75) Inventor: Hiromitsu Takamori, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 0 days.

(21) Appl. No.: 11/264,373

(22) Filed: Nov. 2, 2005

(65) Prior Publication Data

US 2006/0106302 A1    May 18, 2006

(30) Foreign Application Priority Data

Nov. 2, 2004    (JP)    ............................ P2004-319467

(51) Int. Cl.
G01V 3/00    (2006.01)
(52) U.S. Cl. ................... 324/318; 324/322; 324/321; 324/307
(58) Field of Classification Search ......... 324/318–322; 600/410, 421, 422, 425, 427; 333/219–235
See application file for complete search history.

(56) References Cited

U.S. PATENT DOCUMENTS

| | | | | |
|---|---|---|---|---|
| 4,587,493 A | * | 5/1986 | Sepponen | ................... 324/319 |
| 4,805,626 A | * | 2/1989 | DiMassimo et al. | ......... 600/415 |
| 5,085,219 A | | 2/1992 | Ortendahl et al. | ........... 600/422 |
| 5,398,686 A | * | 3/1995 | Inoue et al. | .................. 600/415 |
| 6,675,037 B1 | * | 1/2004 | Tsekos | ....................... 600/417 |
| 6,904,305 B2 | * | 6/2005 | Tsekos | ....................... 600/417 |
| 2002/0021128 A1 | * | 2/2002 | Kuhara | ....................... 324/309 |
| 2002/0123681 A1 | * | 9/2002 | Zuk et al. | ................... 600/410 |
| 2002/0138001 A1 | * | 9/2002 | Kroeckel | .................... 600/410 |
| 2002/0156365 A1 | * | 10/2002 | Tsekos | ....................... 600/411 |
| 2005/0122108 A1 | * | 6/2005 | Yasuhara et al. | ............ 324/318 |
| 2006/0106302 A1 | * | 5/2006 | Takamori | .................... 600/415 |

FOREIGN PATENT DOCUMENTS

JP    2002-10992    1/2002

OTHER PUBLICATIONS

Chinese Office Action dated Jun. 29, 2007.
Office Action dated Jun. 5, 2009 in CN 2008100026650.

* cited by examiner

*Primary Examiner*—Brij B. Shrivastav
*Assistant Examiner*—Tiffany A Fetzner
(74) *Attorney, Agent, or Firm*—Nixon & Vanderhye PC

(57) ABSTRACT

A magnetic resonance imaging apparatus comprising: a magnet configured to form a static magnetic field in an imaging area; a cylindrical structure having a guide; a radio frequency coil configured to receive a nuclear magnetic resonance signal generated by transmitting a radio frequency signal into a object set in the static magnetic field; and a radio frequency coil drive structure configured to adjust a distance between the radio frequency coil and a body surface of the object by using a moving structure configured to move along with the guide, a wire configured to move the moving structure and a motor connected to the wire.

24 Claims, 7 Drawing Sheets

MAGNETIC RESONANCE IMAGING APPARATUS WITH A MOVABLE RF COIL HAVING A CONTROLLABLE DISTANCE BETWEEN THE MOVABLE RF COIL AND AN IMAGED BODY SURFACE

BACKGROUND OF THE INVENTION

1. Field of the Invention

The present invention relates to a magnetic resonance imaging apparatus and a magnetic resonance imaging method which reconstruct an image using a NMR (nuclear magnetic resonance) signal generated by transmitting a RF (radio frequency) signal with a Larmor frequency into an object and forming a gradient magnetic field inside a magnet for a static magnetic field by a gradient coil, and more particularly, to a magnetic resonance imaging apparatus and a magnetic resonance imaging method which allow an image with more satisfactory quality to be obtained by adjusting a distance between a radio frequency coil for receiving the nuclear magnetic resonance signal and a body surface of the object.

2. Description of the Related Art

Conventionally, a magnetic resonance imaging (MRI) apparatus is used as a monitoring apparatus in the medical field.

The magnetic resonance imaging apparatus is an apparatus which reconstructs a tomographic image of an object using an NMR signal generated with excitation by transmitting a RF signal with a Larmor frequency from a RF coil so as to resonate a nuclear spin in the object magnetically and forming a gradient magnetic field changing temporally with a gradient coil on a imaging area of the object set to the inside of a cylindrical magnet for generating a static magnetic field.

In the magnetic resonance imaging apparatus as described above, a local RF coil having a size matched with an imaging area is used as an RF coil receiving NMR signals used for obtaining a tomographic image of a specific part in an object with high sensitivity. For example, a WB (whole-body) RF coil is used imaging a large area having a field of view about 50 cm around. On the other hand, a local RF coil with a size matched to a smaller imaging area, such as a coil for a head, a genicula or a vertebra, is used for receiving MRI signals when an imaging area for a tomogrphic image is limited in advance, i.e. on imaging a part, such as a head, a genicula or a vertebra.

Each local RF coil is optimized for an associated body part. Hence, using a local RF coil specialized for receiving a NMR signal from a specific body part allows a local image to be generated with high sensitivity for each imaged area.

To the contrary, a WB coil allows a larger area to be imaged. However it is difficult to obtain a tomographic image with high sensitivity since the distance from a body surface of an object is farther than that in a case where a local RF coil is used.

On the other hand, a case where it is clinically important image a large area with high sensitivity using local RF coils often occurs. However, it is necessary to use a plurality of local RF coils each specified for imaging each specific part in an object in cases where a large area is imaged using local RF coils. Therefore, it is necessary to take out an object from the bed and reset local RF coils on each change of imaged body part, thereby imposing a burden on an object and an operator. That is, conventional local RF coils are preferable for obtaining a local image of an object while imaging a large area needs complicated operations due to moving of the object and changing to other local RF coils.

In order to solve such a problem, the so called moving-bed method which is conducted by imaging while moving a patient bed was devised for keeping a larger imaging area using a single local RF coil or a limited number of local RF coils (see, for example, Japanese Patent Application (Laid-Open) No. 2002-10992).

FIG. 9 is a diagram explaining a method for imaging a large area by a single local RF coil with moving the bed in a conventional magnetic resonance imaging apparatus.

More specifically, as a magnetic resonance imaging apparatus 1 shown in FIG. 9, a local RF coil unit 3 is arranged in an imaging area formed in a magnet 2 in which a not shown gradient coil unit is built. A large area is imaged by combining tomographic images obtained through imaging over a plurality of times each imaging range S of the local RF coil unit 3 with moving a bed 4 setting an object P.

However, on imaging with the conventional moving-bed method, the distance between the local RF coil unit 3 and the bed 4 is constant without being dependent on a position of the bed 4 as shown in FIG. 9. Therefore, a distance between an object P having an uneven surface and the local RF coil unit 3 varies depending on a position of the bed 4. For example, the distance A1 between the abdominal part of the object P and the local RF coil unit 3 is different from the distance A2 between the leg part of the object P and the local RF coil unit 3.

In other words, a distance between a body surface of an object P and the local RF coil unit 3 is not constant. Hence, the sensitivity of the local RF coil unit 3 becomes uneven, thereby being difficult to obtain a tomographic image with more even sensitivity. This situation leads to reduced quality of a tomographic image.

SUMMARY OF THE INVENTION

The present invention has been made in light of the conventional situations, and it is an object of the present invention to provide a magnetic resonance imaging apparatus and a magnetic resonance imaging method which allow an image with more satisfactory quality to be obtained by adjusting a distance between a local radio frequency coil for receiving the nuclear magnetic resonance signal and a body surface of the object so as to be a more appropriate distance.

The present invention provides a magnetic resonance imaging apparatus comprising: a magnet configured to form a static magnetic field in an imaging area; a cylindrical structure having a guide; a radio frequency coil configured to receive a nuclear magnetic resonance signal generated by transmitting a radio frequency signal into a object set in the static magnetic field; and a radio frequency coil drive structure configured to adjust a distance between the radio frequency coil and a body surface of the object by using a moving structure configured to move along with the guide, a wire configured to move the moving structure and a motor connected to the wire, in an aspect to achieve the object.

The present invention also provides a magnetic resonance imaging apparatus comprising: a magnet configured to form a static magnetic field in an imaging area; a radio frequency coil configured to receive a nuclear magnetic resonance signal generated by transmitting a radio frequency signal into a object set in the static magnetic field; and a radio frequency coil drive structure configured to adjust a distance between the radio frequency coil and a body surface of the object by moving a position of the radio frequency coil with a wire, in an aspect to achieve the object.

The present invention also provides a magnetic resonance imaging apparatus comprising: a magnet configured to form a static magnetic field in an imaging area; a cylindrical structure having a guide; a radio frequency coil configured to receive a nuclear magnetic resonance signal generated by transmitting a radio frequency signal into a object set in the static magnetic field; and a radio frequency coil drive structure configured to adjust a distance between the radio frequency coil and a body surface of the object by moving a position of the radio frequency coil along the guide serving as a moving locus, in an aspect to achieve the object.

The present invention also provides a magnetic resonance imaging apparatus comprising: a magnet configured to form a static magnetic field in an imaging area; a radio frequency coil configured to receive a nuclear magnetic resonance signal generated by transmitting a radio frequency signal into a object set in the static magnetic field; and a radio frequency coil drive structure configured to adjust a distance between the radio frequency coil and a body surface of the object by moving a position of the radio frequency coil and return the position of the radio frequency coil to a regular position with stability of an elastic body, in an aspect to achieve the object.

The present invention also provides a magnetic resonance imaging apparatus comprising: a magnet configured to form a static magnetic field in an imaging area; a radio frequency coil configured to receive a nuclear magnetic resonance signal generated by transmitting a radio frequency signal into a object set in the static magnetic field; and a radio frequency coil drive structure configured to adjust a distance between the radio frequency coil and a body surface of the object and a direction of the radio frequency coil by moving positions of at least two points on the radio frequency coil, in an aspect to achieve the object.

The present invention also provides a magnetic resonance imaging method comprising steps of: forming a static magnetic field in an imaging area; adjusting a distance between a radio frequency coil and a body surface of a object set in the static magnetic field by using a moving structure configured to move along with a guide included in a cylindrical structure, a wire configured to move the moving structure and a motor connected to the wire; and receiving a nuclear magnetic resonance signal generated by transmitting a radio frequency signal into the object with the radio frequency coil, in an aspect to achieve the object.

The present invention also provides a magnetic resonance imaging method comprising steps of: forming a static magnetic field in an imaging area; adjusting a distance between a radio frequency coil and a body surface of a object set in the static magnetic field by moving a position of the radio frequency coil by a wire; and receiving a nuclear magnetic resonance signal generated by transmitting a radio frequency signal into the object with the radio frequency coil, in an aspect to achieve the object.

The present invention also provides a magnetic resonance imaging method comprising steps of: forming a static magnetic field in an imaging area; adjusting a distance between a radio frequency coil and a body surface of a object set in the static magnetic field by moving a position of the radio frequency coil along a guide of a cylindrical structure serving as a moving locus; and receiving a nuclear magnetic resonance signal generated by transmitting a radio frequency signal into the object with the radio frequency coil, in an aspect to achieve the object.

The present invention also provides a magnetic resonance imaging method comprising steps of: forming a static magnetic field in an imaging area; adjusting a distance between a radio frequency coil and a body surface of a object set in the static magnetic field by moving a position of the radio frequency coil; receiving a nuclear magnetic resonance signal generated by transmitting a radio frequency signal into the object with the radio frequency coil; and returning the position of the radio frequency coil to a regular position with stability of an elastic body, in an aspect to achieve the object.

The present invention also provides a magnetic resonance imaging method comprising steps of: forming a static magnetic field in an imaging area; adjusting a distance between a radio frequency coil and a body surface of an object set in the static magnetic field and a direction of the radio frequency coil by moving positions of at least two points on the radio frequency coil; and receiving a nuclear magnetic resonance signal generated by transmitting a radio frequency signal into the object with the radio frequency coil, in an aspect to achieve the object.

The magnetic resonance imaging apparatus and the magnetic resonance imaging method as described above make it possible to allow an image with more satisfactory quality to be obtained by adjusting a distance between a local radio frequency coil for receiving the nuclear magnetic resonance signal and a body surface of the object so as to be a more appropriate distance.

BRIEF DESCRIPTION OF THE DRAWINGS

In the accompanying drawings (where identical reference characters are used in different figures to refer to identical structures).

DESCRIPTION OF THE PREFERRED EMBODIMENTS

A magnetic resonance imaging apparatus and a magnetic resonance imaging method according to embodiments of the present invention will be described with reference to the accompanying drawings.

Figure 1:
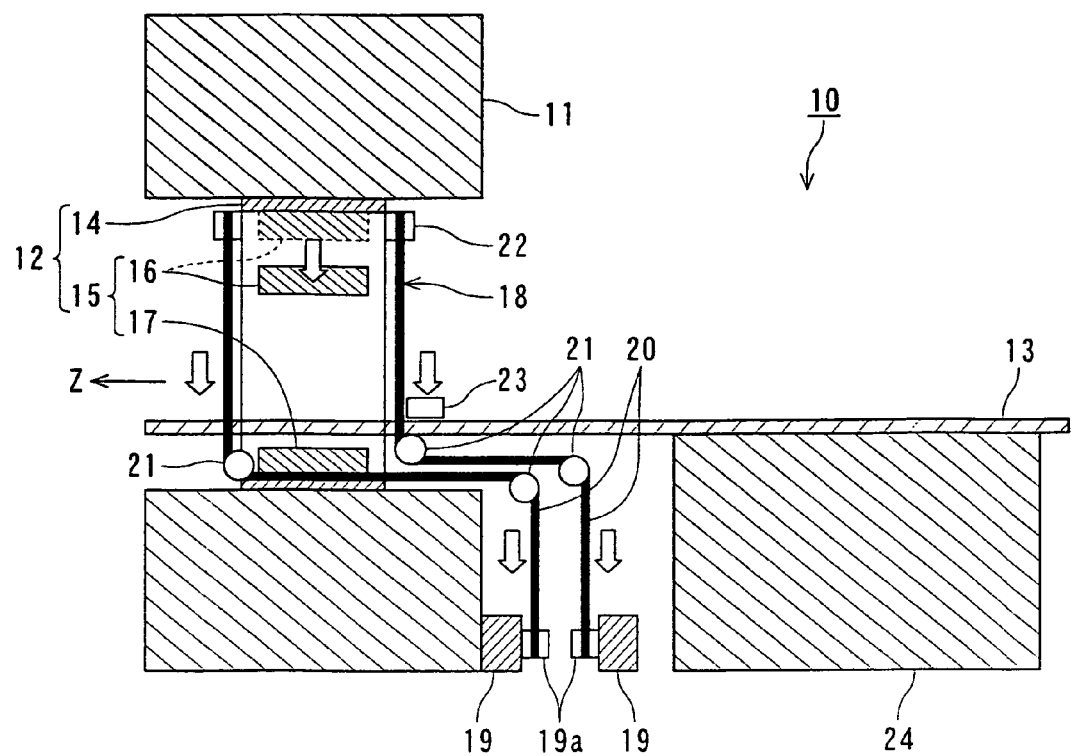
FIG. 1 is a diagram showing a magnetic resonance imaging apparatus according to a first embodiment of the present invention.

FIG. 1 is a diagram showing a magnetic resonance imaging apparatus according to a first embodiment of the present invention.

A magnetic resonance imaging apparatus 10 includes a magnet 11 and a RF coil unit 12. The magnet 11 housing gradient coils (not shown) is used for forming a static magnetic field. The magnet 11 is formed cylindrically. An imaging area is set in the inside of the magnet 11. The RF coil unit 12 and a bed 13 for setting an object are also arranged in the inside of the magnet 11.

The RF coil unit 12 has a WB coil 14 and a local RF coil set 15. The WB coil 14 may not be provided. The WB coil 14 images a large area of an about 50 cm view for example. The local RF coil set 15 including a coil for use on a head, a genicula and a spine images a specific part including a head, a genicula and a spine.

The WB coil 14 is formed cylindrically. An arbitrary number of the local RF coils 15 each having a predetermined shape are arranged at arbitrary positions in the inside of the WB coil 14. For example, the local RF coil set 15 includes a pair of a movable RF coil 16 and an immobile RF coil 17 which are arranged so as to mutually oppose each other.

The immobile RF coil 17 is settled to the inside of the WB coil 14 for example. A RF coil drive structure 18 is provided with the movable RF coil 16 which allows the movable RF coil 16 to move to the predetermined direction, e.g. to the immobile RF coil 17 side opposite to the movable RF coil 16. The RF coil drive structure 18 and the RF coil unit 12 form a RF coil unit.

The WB coil 14 is formed cylindrical. An arbitrary number of the local RF coils 15 each having a predetermined shape are arranged at arbitrary positions in the inside of the WB coil 14. For example, the local RF coil set 15 includes a pair of a movable RF coil 16 and an immobile RF coil 17 which are arranged so as to counter mutually.

The immobile RF coil 17 is settled to the inside of the WB coil 14 for example. A RF coil drive structure 18 is provided with the movable RF coil 16 which allows the movable RF coil 16 to move to the predetermined direction, e.g. to the immobile RF coil 17 side countering to the movable RF coil 16. The RF coil drive structure 118 and the RF coil unit 12 form a RF coil unit.

The RF coil drive structure 18 can include an arbitrary element. For example, the RF coil drive structure 18 includes motors 19, wires 20 having non-conductivity and pulleys 21.

More specifically, the wires 20 are laid on output shafts 19a of the motors 19 respectively so that power from motors 19 is transmitted to the wires 20 respectively. The pulleys 21 are provided in various places of the wires 20 so that each required re-direction of wires 20 is accommodated. A power transmission structure 22 having a link construction is provided with the movable RF coil 16 so that the power transmission structure 11 transmits power from wires 20 to movable RF coil 16. Therefore, since the power from motors 19 is respectively transmitted to the movable RF coil 16 via wires 20, the movable RF coil 16 can be moved to the immobile RF coil 17 side by driving motors 19.

In addition, wire adjusting structures 23 are provided with the RF coil drive structure 18. Each of the wire adjusting structures 23 has a function to adjust tensions of the wires 20. Therefore, even if the wires 20 are extended by a variation per hour or the wires 20 have relaxations, the wire adjusting structures 23 adjust the tensions of the wires 20 so that the effect of extensions or relaxations of the wires 20 is reduced.

Furthermore, a bed driving structure 24 is provided with the bed 13 so that the bed driving structure 24 allows the bed 13 to move to a predetermined direction, e.g. to a body axis Z direction of the object which is set as the axis direction in the magnet 11. Therefore, each of the WB coil 14, the immobile RF coil 17 and the movable RF coil 16 can change a position in the body axis Z direction relatively to the bed 13 and the object. In addition, since the movable RF coil 16 can be moved to the immobile RF coil 17 side by the power transmission structure 22, the movable RF coil 16 can change a position in the two directions of a direction vertical to the body axis Z as well as the body axis Z direction relatively to the bed 13 and the object.

Figure 2:
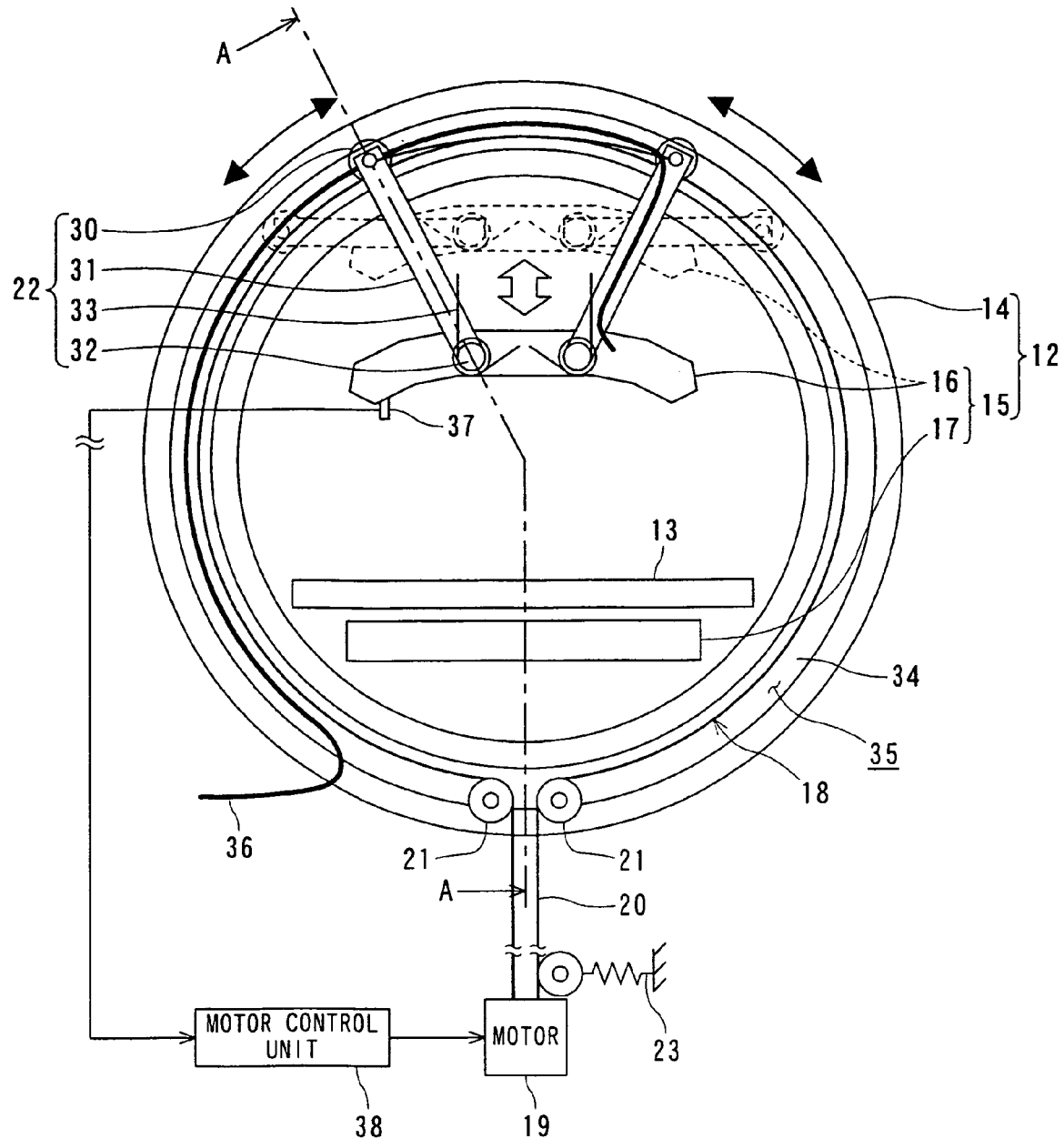
FIG. 2 is a front view of an example of detailed structure of the RF coil drive structure 18 in the magnetic resonance imaging apparatus 10 shown in FIG. 1.
Figure 3:
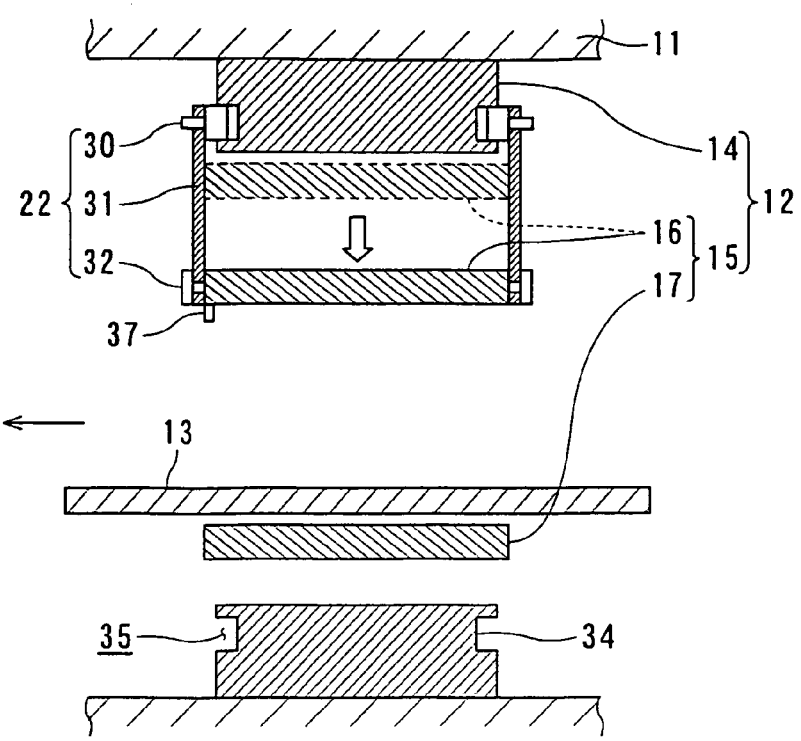
FIG. 3 is an A-A sectional view shown in FIG. 2.

FIG. 2 is a front view of an example of detailed structure of the RF coil drive structure 18 in the magnetic resonance imaging apparatus 10 shown in FIG. 1. FIG. 3 is an A-A sectional view shown in FIG. 2.

As shown in FIGS. 2 and 3, the bed 13, the movable RF coil 16 and the immobile RF coil 17 are arranged in the cylindrical WB coil 14. Furthermore, the RF coil drive structure 18 allows the movable RF coil 16 to move.

The power transmission structure 22 of the RF coil drive structure 18 has a structure as shown in FIG. 2 for example. That is, the power transmission structure 22 has rollers 30 each serving as an example of a moving structure, arms 31, rotating shafts 32 and springs 33 each serving as an example of an elastic body. For example, the two rotating shafts 32 (of the total of four rotating shafts 32) are arranged at each end of the movable RF coil 16 respectively so that the two rotating shafts of each end are in horizontal positions with respect to each other. Each of the rollers 30 is arranged on each one end of the four bar-shaped arms 31. On the other hand, each of the rotating shafts 32 is rotatably inserted in a hole arranged on each of the other ends of the arms 31. In other words, the four arms 31 arranged on all sides support the movable RF coil 16 via the rotating shafts 32.

Each of the springs 33 is mounted on each of the rotating shafts 32 so that stability of each spring 33 acts on each of the arms 31 in the direction in which the each position of the arms 31 relative to the movable RF coil 16 returns to the regular position. For example, a force acts on each of the arms 31 in the direction in which each longitudinal direction of the arms 31 goes horizontally. Therefore, the two arms 31 on the same side of the movable RF coil 16 go horizontally so as to open mutually by the given forces. On the other hand, the forces given from the two arms 31 constantly act perpendicularly on the movable RF coil 16.

Furthermore, the WB coil 14 generally has WB bobbins 34 so as to form grooves 35 on both sides of the WB coil 14. The wires 20 and the rollers 30 which are elements of the RF coil drive structure 18 as well as cables 36 for transmitting electric power and signals to the movable RF coil 16 are put in the grooves 35 of the WB bobbins 34. That is, the grooves 35 of the WB bobbins 34 function as guides for the wires 20, the rollers 30 and the cables 36 for transmitting control signals to the movable RF coil 16. The each opposite side of the arms 31 to the movable Rf coil 16 is linked with each of the rollers 30 movably arranged in the grooves 35 of the WB bobbins 34. The cables 36 are settled with the wires 20 and/or the arms 31, as needed. The ends of the cables 36 passing through the grooves 35 of the WB bobbins 34 are connected to external circuits (not shown).

On the other hand, the pulleys 21 are arranged on the installation surface side of both ends of the WB coil 14. Each one end of the nonconductive wires 20 which are guided with grooves 35 of the WB bobbins 34 is connected with arms 31 near the rollers 30 while each other ends of wires 20 which are respectively guided for the installation surface side of the WB coil 14 with the pulleys 21 is linked with one of the output shafts 19a included in the motors 19. The two wires 20 respectively linked with the two rollers 30 put in the common groove 35 of the WB bobbin 34 cross mutually.

Furthermore, the wire adjusting structures 23 are contacted with arbitrary positions on the wires 20, e.g. the positions near the motors 19 respectively. For example, each of the wire adjusting structures 23 includes a pulley and an elastic body, such as a spring. One end of the elastic body is fixed while the other end is linked with the pulley. Each of the pulleys of the wire adjusting structures 23 is contacted with each of the wires 20 so that each elastic force of the elastic bodies keep each tension of the wires 20 constant. In this way, powers of the motors 19 constantly are transmitted to the movable RF coil 16 via the wires 20.

Hereby, when the power of the motor 19 moves the two wires 20 put on the common the groove 35 of the WB bobbin 34 to the installation surface side of the WB coil 14, the two rollers 30 respectively linked with the two arms 31 roll and move on the inner surface of the groove 35 of the WB bobbin 34 so as to approach mutually. Herewith, the two arms 31 opposing the stability of the springs 33 become V-shaped, thereby the movable RF coil 16 approaching the immobile RF coil 17.

Furthermore, a sensor 37 for detecting a position of the movable RF coil 16 is provided with the movable RF coil 16. For example, the sensor 37 has a micro switch. The sensor 37 detects a distance between the movable RF coil 16 and a body surface of an object or the movable RF coil 16 and the immobile RF coil 17. The sensor 37 outputs a detection signal to a motor control unit 38.

The motor control unit 38 has a function to control the motors 19 by giving control signals to the motors 19 based on the detection signal from the sensor 37. More specifically, the motor control unit 38 controls the motors 19 in accordance with the detection signal from the sensor 37 so that the distance between the movable RF coil 16 and a body surface of an object or the movable RF coil 16 and the immobile RF coil 17 becomes a target one.

With this structure, power from motors 19 controlled by the motor control unit 38 is transmitted from the output shafts 19a to the respective wires 20, rollers 30, arms 31, springs 33 and rotating shafts 32. Thus, the distance between the movable RF coil 16 and a body surface of an object or the movable RF coil 16 and the immobile RF coil 17 can be set to an arbitrary one by adjusting the amounts of movements of wires 20 in accordance with the detection signal of sensor 37 and driving of motors 19.

Figure 4:
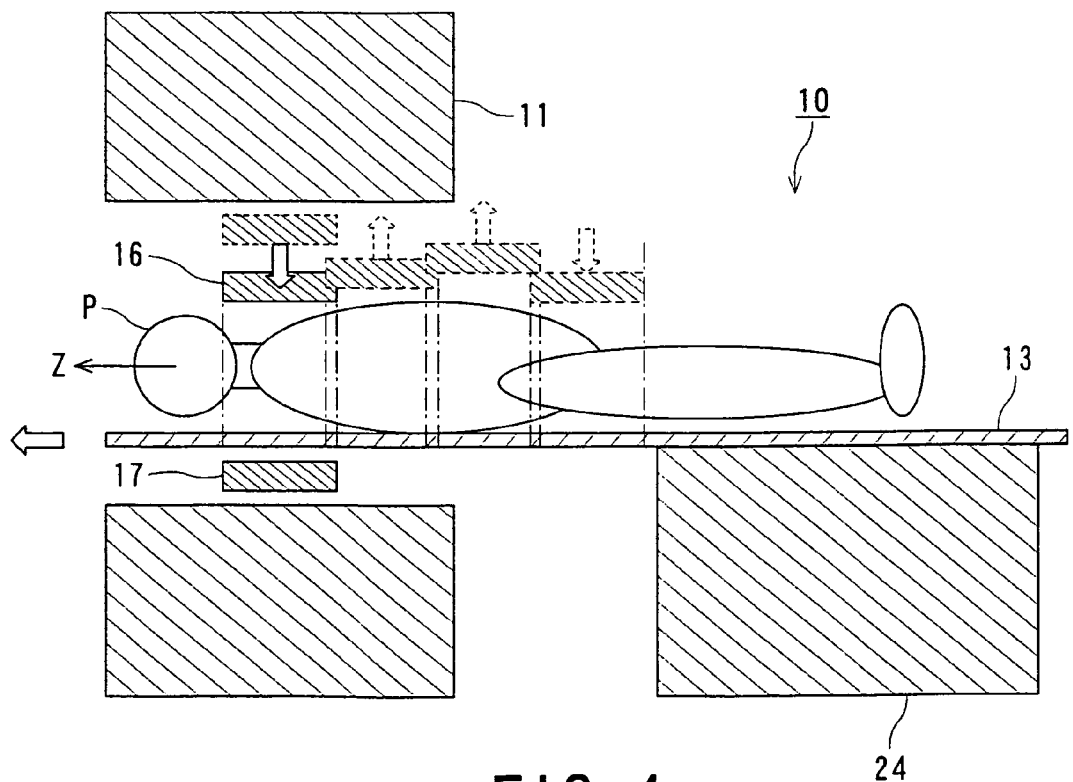
FIG. 4 is a diagram explaining an example of method for driving the movable RF coil 16 of the magnetic resonance imaging apparatus 10 shown in FIG. 1.

FIG. 4 is a diagram explaining an example of method for driving the movable RF coil 16 of the magnetic resonance imaging apparatus 10 shown in FIG. 1. In FIG. 4, illustration of the WB coil 14 and the RF coil drive structure 18 is omitted.

Referring to FIG. 4, an object P is set on the bed 13. The bed driving structure 24 moves the bed 13 in the body axis Z direction of the object P. With moving the bed 13, the RF coil drive structure 18 moves the movable RF coil 16 so that the vertical distance between the movable RF coil 16 and the body surface of the object P becomes constant.

In this way, imaging can be performed with appropriately adjusting the distance between the movable RF coil 16 and the body surface of the object P by moving the movable RF coil 16 in vertical direction every imaging area corresponding to a position of the bed 13.

Therefore, with the magnetic resonance imaging apparatus 10 as described above, the single movable RF coil 16 can cover a large imaging area while a highly sensitive image can be obtained on each imaging area without moving of an object P giving a burden and operation of users including a doctor and a technical expert. In addition, the wires 20 which are main elements of the RF coil drive structure 18 are put in the grooves 35 of the WB bobbins 34, thereby keeping livability of an object P without reduction of a space for the object P.

Note that, although an example of method for moving the wires 20 by the motors 19 is shown, a structure for moving the wires 20 by hand motion is also applicable. In addition, a structure for moving the movable RF coil 16 by a moving structure, such as the rollers 30, using guides forming moving loci, such as rails, grooves and so on, provided on another cylindrical body instead of using the WB coil 14.

Figure 5:
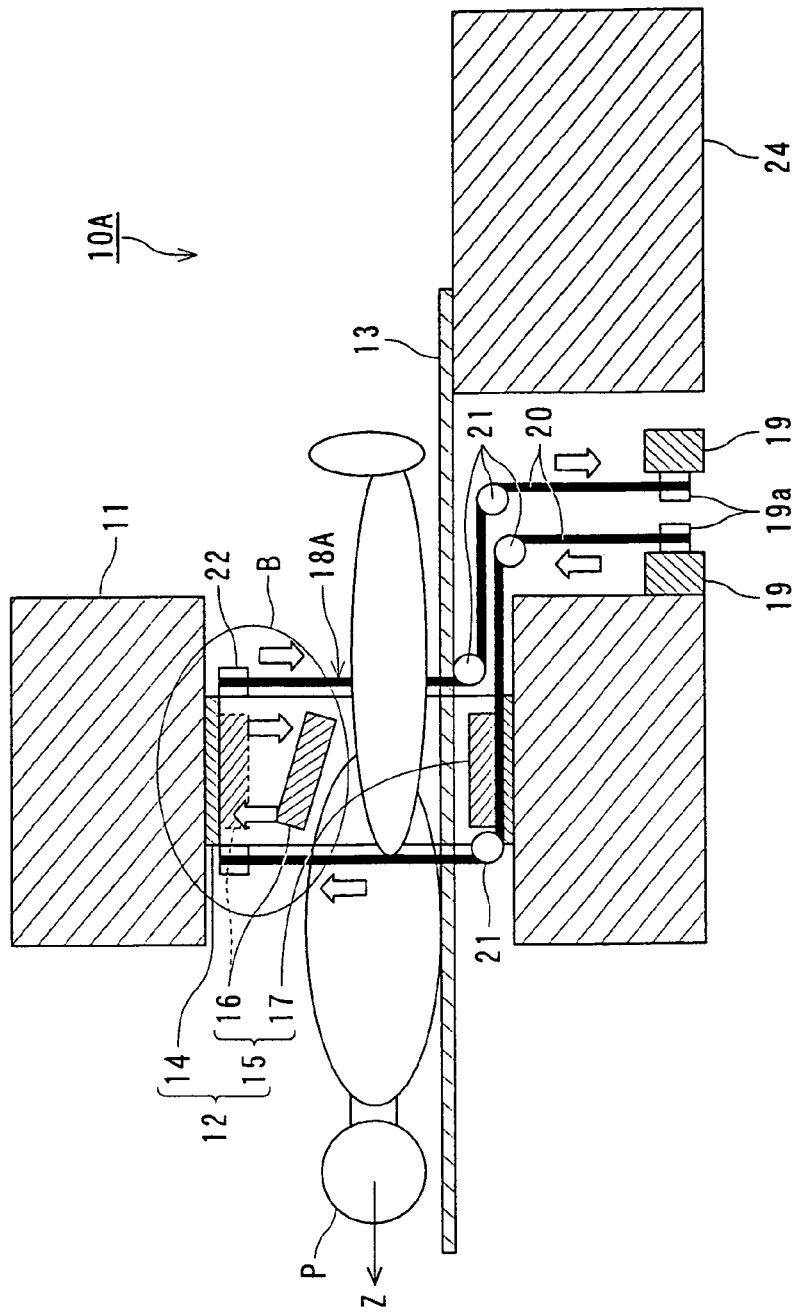
FIG. 5 is a diagram showing a magnetic resonance imaging apparatus according to a second embodiment of the present invention.

FIG. 5 is a diagram showing a magnetic resonance imaging apparatus according to a second embodiment of the present invention.

In the magnetic resonance imaging apparatus 10A shown in FIG. 5, a structure and function of the RF coil drive structure 18A are different from those of the magnetic resonance imaging apparatus 10 shown in FIG. 1. Other constructions and operations of the magnetic resonance imaging apparatus 10A are not substantially different from those of the magnetic resonance imaging apparatus 10 shown in FIG. 1. Therefore, the same reference numbers are used to identify the same elements as those of the magnetic resonance imaging apparatus 10 without again explaining their respective structures and functions.

The RF coil drive structure 18A of the magnetic resonance imaging apparatus 10A has an arbitrary structure. For example, the RF coil drive structure 18A includes motors 19, nonconductive wires 20, pulleys 21 and a power transmission structure 22. Then, power from motors 19 is transmitted to the movable RF coil 16 via the power transmission structure 22 and respectively corresponding wires 20 having directions adjusted by the pulleys 21 so that driving of motors 19 moves the movable RF coil 16 to the immobile RF coil 17 side, like the RF coil drive structure 18 of the magnetic resonance imaging apparatus 10 previously described in connection with FIG. 1.

In addition, the RF coil drive structure 18A can adjust an angle of the movable RF coil 16. For example, as shown in FIG. 5, amounts of movements and/or directions of movements with regard to the wires 20 for transmitting power to both ends of the movable RF coil 16 are controlled to become different thereby controlling the angle of the movable RF coil 16 so that a distance between the movable RF coil 16 and a body surface of an object P becomes more constant.

Figure 6:
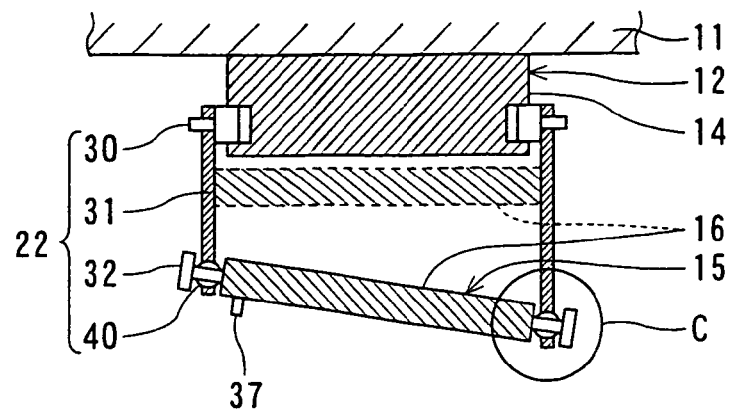
FIG. 6 is a sectional view showing an example of a detailed structure of the power transmission structure 22 in the magnetic resonance imaging apparatus 10A shown in the area B of FIG. 5.
Figure 7:
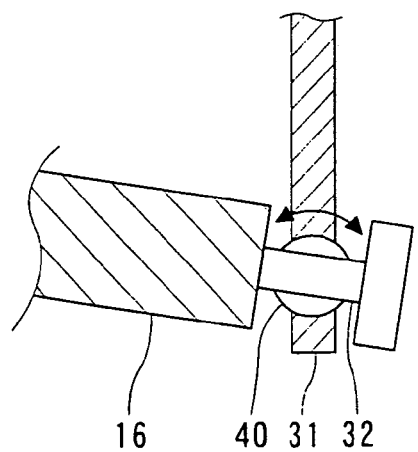
FIG. 7 is an expanded sectional view of the C area shown in FIG. 6.

FIG. 6 is a sectional view showing an example of a detailed structure of the power transmission structure 22 in the magnetic resonance imaging apparatus 10A shown in the area B of FIG. 5. FIG. 7 is an expanded sectional view of the C area shown in FIG. 6.

For example, the power transmission structure 22 of the RF coil drive structure 18A has a structure as shown in FIGS. 6 and 7. More specifically, the power transmission structure 22 includes rollers 30, arms 31, rotating shafts 32, pillow balls (spherical rolling bearings) 40, and springs 33. The power transmission structure 22 of the RF coil drive structure 18A is substantially similar to that of the RF coil drive structure 18 shown in FIGS. 2 and 3 except for providing the pillow balls 40. Therefore, explanation will be described with reference to a diagram showing only near the pillow balls 40.

The power transmission structure 22 of the RF coil drive structure 18A has the pillow balls 40. The pillow ball 40 is a bearing having a spherical reception face and a through-bore. Each of the pillow balls 40 is arranged on a linking part between each arm 31 and rotating shaft 32. Each of the rotating shafts 32 is inserted in each through-bore of the pillow balls 40 while each spherical reception face of the pillow balls 40 receives each of the arms 31. Thus, the angle between each arm 31 and rotating shaft 32 provided with the movable RF coil 16, i.e. the direction of the movable RF coil 16 can be changed arbitrarily. For example, the pillow balls 40 can arbitrarily change the angle of the movable RF coil 16 on a plane parallel to a body axis Z direction and vertical to a horizontal plane as shown in FIG. 5.

The magnetic resonance imaging apparatus 10A as described above can keep the distance between the movable RF coil 16 and a body surface of an object P more constant as well as obtain advantages similar to those of the magnetic resonance imaging apparatus 10 shown in FIG. 1 by changing the angle of the movable RF coil 16 in accordance with uneven body surfaces of the object P which may exist. Particularly, if the apparatus is configured to allow the angle of the movable RF coil 16 on a plane parallel to a body axis Z direction and vertical to a horizontal plane to be changed arbitrarily, the direction of the movable RF coil 16 can be set to one with higher needs along a body surface of an object P. Consequently, image data with high sensitivity and satisfactory image results can be obtained with the single movable RF coil 16.

In addition, changeability of the direction of the movable RF coil 16 achieved by adjusting the position of each point of at least two points at which the movable RF coil 16 is supported allows positioning of the movable RF coil 16 with high accuracy and stability. In other words, orientation of the movable RF coil 16 to a set direction can be improved.

In addition, changeability of the direction of the movable RF coil 16 achieved by adjusting position of each point of at least two points at which the movable RF coil 16 is supported allows positioning of the movable RF coil 16 with high accuracy and stability. In other word, levelness of the movable RF coil 16 to a set direction can be improved.

Figure 8:
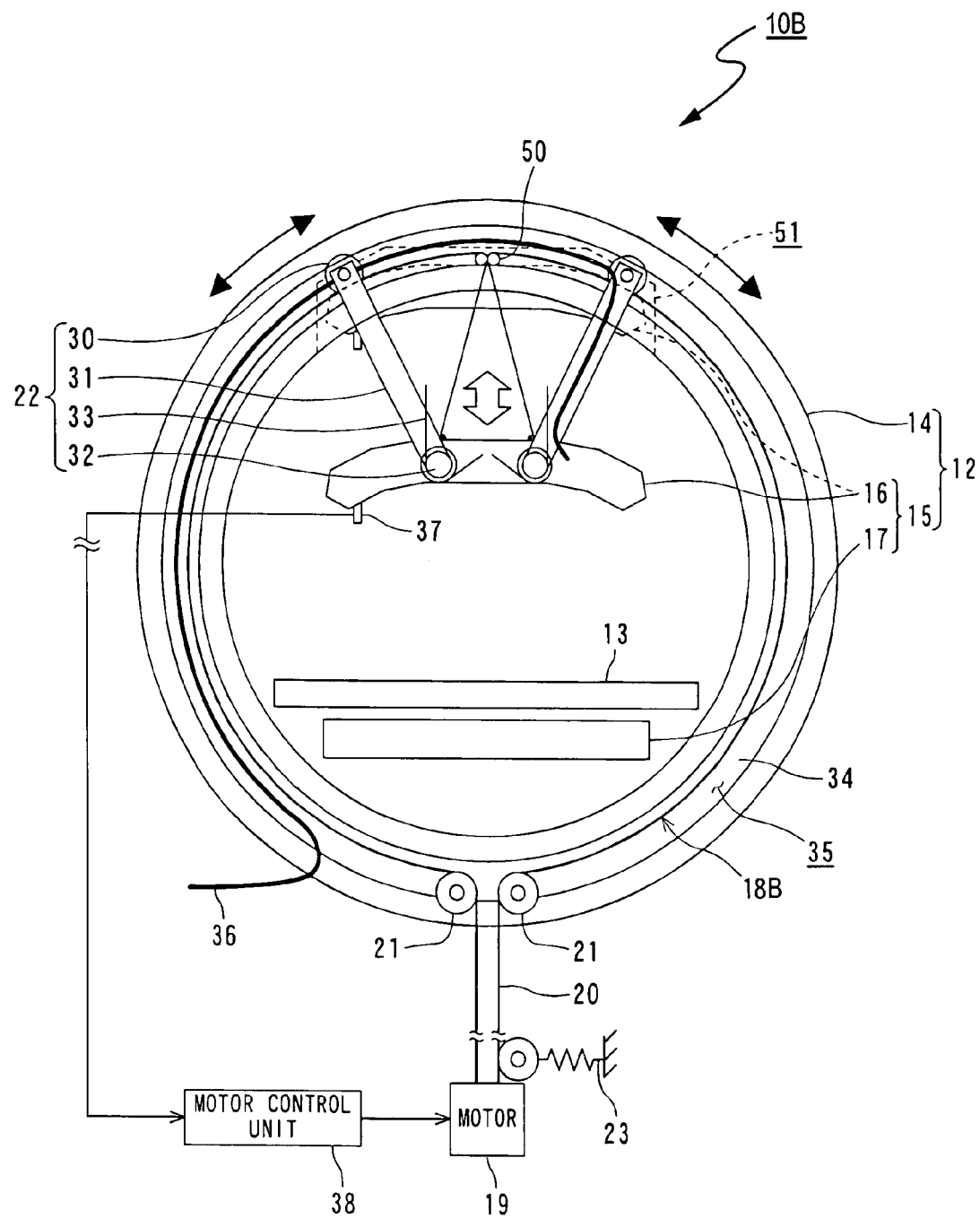
FIG. 8 is a diagram showing a magnetic resonance imaging apparatus according to a third embodiment of the present invention.
Figure 9:
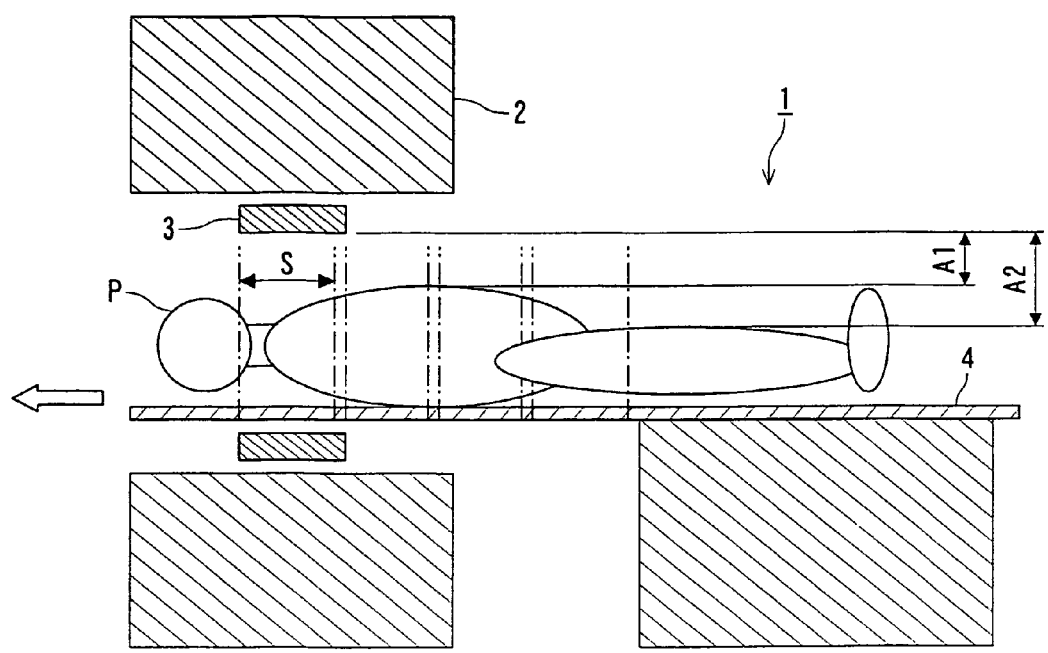
FIG. 9 is a diagram explaining a method for imaging a large area by a single local RF coil with moving the bed in a conventional magnetic resonance imaging apparatus.

FIG. 8 is a diagram showing a magnetic resonance imaging apparatus according to a third embodiment of the present invention.

In the magnetic resonance imaging apparatus 10B shown in FIG. 8, a structure and function of the RF coil drive structure 18B are different from those of the magnetic resonance imaging apparatus 10 shown in FIG. 1. Other constructions and operations of the magnetic resonance imaging apparatus 10B are not substantially different from those of the magnetic resonance imaging apparatus 10 shown in FIG. 1. Therefore, the same reference numbers are used to identify the same corresponding elements as found in magnetic resonance imaging apparatus 10 without repeating explanation thereof.

The RF coil drive structure 18B of the magnetic resonance imaging apparatus 10B has a function to park the movable RF coil 16. That is, the RF coil drive structure 18B also functions as a parking structure. The RF coil drive structure 18B has coil side rollers 50 corresponding to the wires 20 respectively. The coil side rollers 50 are arranged at positions sufficiently far from the bed 13 on both sides of the WB coil 14. Each one end of the wires 20 whose directions are steered to the movable RF coil 16 side respectively by the coil side rollers 50 is not linked with the roller 30 of the power transmission structure 22, but fixed with the movable RF coil 16.

On the other hand, the WB coil 14 has a hollow, serving as a parking space 51, according to the shape of the movable RF coil 16. That is, the parking space 51 of the WB coil 14 also forms the parking structure.

Each of the springs 33 of the power transmission structure 22 has elastic force acting in the rotative direction in which each longitudinal direction of the arms 31 gets into vertical to the movable RF coil 16. Therefore, each elastic force of the springs 33 constantly gives to the movable RF coil 16 a force heading for the bed 13 side. Consequently, when driving of the motors 19 reels off the wires 20, the movable RF coil 16 moves in the direction far from the bed 13 so as to adjust a position of the movable RF coil 16.

When the movable RF coil 16 is to be parked, driving of the motors 19 moves the movable RF coil 16 to a position farther from the bed 13. Then, the movable RF coil 16 moves into the parking space 51 to be in a parked status. Because of such a situation, a shape of parking space 51 and each position of coil side rollers 50 are designed according to the shape and the parking position of the movable RF coil 16.

With the magnetic resonance imaging apparatus 10B having a structure as described above, the movable RF coil 16 can be parked in a predetermined position on disuse. Then, a RF coil having a desired shape can be easily used at the same time.

Note that, a parking structure independent from the RF coil drive structure 18B may be provided in the magnetic resonance imaging apparatus 10B, not only the example shown in FIG. 8.

Furthermore, each element of the magnetic resonance imaging apparatuses 10, 10A, and 10B in embodiments as described above may be combined mutually to constitute a magnetic resonance imaging apparatus. On the other hand, partial element or function of the magnetic resonance imaging apparatuses 10, 10A, and 10B may be omitted.

What is claimed is:

1. A magnetic resonance imaging apparatus comprising:
   a magnet configured to form a static magnetic field directed along a z-axis in a three-dimensional imaging area extending along said z-axis and in orthogonal x and y axes;
   a cylindrical structure of fixed diameter with an axis extending along said z-axis direction and providing an arcuate guide of fixed diameter extending at least partially circumferentially about said z-axis of said cylindrical structure;
   a movable radio frequency coil configured to receive a nuclear magnetic resonance signal generated by transmitting a radio frequency signal into an object set in the imaging area of the static magnetic field; and
   a radio frequency coil drive structure configured to adjust a distance between the movable radio frequency coil and a body surface of the object, said drive structure including coil supporting links having respective first end portions configured to pivotally move along the arcuate guide and second end portions pivotally connected to said movable radio frequency coil, at least one elongated flexible member configured to move under tension along an arcuate path along at least part of said cylindrical structure and connected to move said movable radio frequency coil and said first end portions of the supporting links in response to movements of said at least one elongated flexible member, and a motor connected to drive said at least one elongated flexible member.

2. A magnetic resonance imaging apparatus according to claim 1, further comprising:
   a parking structure configured to park the radio frequency coil at a stable predetermined position in response to a predetermined driven condition of said elongated flexible member.

3. A magnetic resonance imaging apparatus according to claim 1, wherein said elongated flexible member comprises a tensioned wire and said drive structure is configured to adjust tension of the wire.

4. A magnetic resonance imaging apparatus according to claim 1, wherein:
   the arcuate guide comprises at least one of a groove and a rail.

5. A magnetic resonance imaging apparatus according to claim 1, further comprising:
   a bed support for said object and a bed driving structure configured to move the bed along the z-axis direction;

wherein said adjusted distance of the coil is automatically changed together with movement of the bed.

6. A magnetic resonance imaging apparatus comprising:
a magnet configured to form a static magnetic field directed along a z-axis in a three-dimensional imaging area extending along said z-axis and in orthogonal x and y axes;
a movable radio frequency coil configured to receive a nuclear magnetic resonance signal generated by transmitting a radio frequency signal into an object set in the imaging area of the static magnetic field;
a radio frequency coil drive structure including rigid connecting bars which link and support said movable coil with a rotatable bearing at a first end of the bar and a rotatable connection to the coil at a second end of the connecting bar and at least one elongated flexible member connected under tension to said first ends of said rigid connecting bars, said drive structure being configured to adjust a distance in at least the y-axis direction between the movable radio frequency coil and a body surface of the object by adjusting an effective deployed length of the at least one elongated flexible member; and
a detection unit configured to detect a distance between the radio frequency coil and a body surface of the object and to control said drive structure in response to said detected distance.

7. A magnetic resonance imaging apparatus according to claim 6, further comprising:
a parking structure configured to park the radio frequency coil at stable predetermined position in response to a predetermined driven condition of said elongated flexible member.

8. A magnetic resonance imaging apparatus according to claim 6, wherein:
said elongated flexible member comprises a wire and said drive structure is configured to adjust tension of the wire.

9. A magnetic resonance imaging apparatus according to claim 2, wherein:
a cylindrical structure has arcuate guides extending circumferentially within the cylindrical structure and pivotally connected to said rigid connecting bars and comprises at least one of a groove and a rail.

10. A magnetic resonance imaging apparatus according to claim 6, further comprising:
a bed support for said object and a bed driving structure configured to move the bed along the z-axis direction of the object;
wherein said adjusted distance of the coil is automatically changed together with movement of the bed.

11. A magnetic resonance imaging apparatus according to claim 6, further comprising:
an arcuate structure having a groove configured for arcuately guiding a wire to adjust the position of the movable radio frequency coil.

12. A magnetic resonance imaging apparatus according to claim 6, wherein:
the radio frequency coil drive structure is configured to adjust the position of the radio frequency coil by use of a wire guided around and within an arcuate groove in a bobbin of a whole body radio frequency MRI coil.

13. A magnetic resonance imaging apparatus according to claim 6, wherein:
the radio frequency coil drive structure includes a power transmission structure comprising a wire as said elongated flexible member and utilizing said rigid connecting bars in order to couple together the wire and the movable radio frequency coil.

14. A magnetic resonance imaging apparatus according to claim 6, wherein:
the radio frequency coil drive structure is configured to adjust an angle of the radio frequency coil with respect to the object by controlling different lengths of plural elongated flexible member associated with different positions on the radio frequency coil.

15. A magnetic resonance imaging apparatus comprising:
a magnet configured to form a static magnetic field directed along a z-axis in a three-dimensional imaging area extending along said z-axis and in orthogonal x and y axes;
a cylindrical structure of fixed diameter with an axis extending along said z-axis direction and providing an arcuate guide of fixed diameter extending at least partially around said imaging area;
a movable radio frequency coil configured to receive a nuclear magnetic resonance signal generated by transmitting a radio frequency signal into an object set in the imaging area of the static magnetic field; and
a radio frequency coil drive structure including rigid coil support links pivotally mounted at first ends to the coil and pivotally mounted at second ends for movement along said arcuate guide and configured to adjust a distance in at least the y-axis direction between the movable radio frequency coil and a body surface of the object by moving at least one second end portion of said links along the arcuate guide.

16. A magnetic resonance imaging apparatus according to claim 15, further comprising:
a parking structure configured to park the radio frequency coil at a stable predetermined position in response to a predetermined driven condition of said elongated flexible member.

17. A magnetic resonance imaging apparatus according to claim 15, wherein: the arcuate guide comprises at least one of a groove and a rail.

18. A magnetic resonance imaging apparatus according to claim 15, further comprising:
a bed support for said object and a bed driving structure configured to move the bed along the z-axis direction of the object;
wherein said adjusted distance of the coil is automatically changed together with movement of the bed.

19. A magnetic resonance imaging apparatus comprising:
a magnet configured to form a static magnetic field directed along a z-axis in a three-dimensional imaging area extending along said z-axis and in orthogonal x and y axes;
a movable radio frequency coil configured to receive a nuclear magnetic resonance signal generated by transmitting a radio frequency signal into an object set in the imaging area of the static magnetic field;
a radio frequency coil drive structure including at least one elongated flexible member coupled under tension to said coil and configured to adjust a distance in at least the y-axis direction between the radio frequency coil and a body surface of the object by moving said elongated flexible member and thereby moving a position of the radio frequency coil and including at least one spring member configured to maintain the position of the radio frequency coil at a stable parked position unless a spring force exerted by said spring member is overcome; and
a detection unit configured to detect a distance between the radio frequency coil and a body surface of the object and to control said drive structure in response to said detected distance.

20. A magnetic resonance imaging apparatus according to claim 19, further comprising:

a parking structure configured to park the radio frequency coil at a stable predetermined position in response to a predetermined driven condition of said elongated flexible member.

21. A magnetic resonance imaging apparatus comprising:

a magnet configured to form a static magnetic field directed along a z-axis in a three-dimensional imaging area extending along said z-axis and in orthogonal x and y axes;

a movable radio frequency coil configured to receive a nuclear magnetic resonance signal generated by transmitting a radio frequency signal into an object set in the imaging area of the static magnetic field; and a radio frequency coil drive structure configured to adjust distances in at least the y-axis direction between the radio frequency coil and a body surface of the object and the radio frequency coil by differentially moving respectively associated different points on the movable radio frequency coil in at least the y-axis direction, thereby changing the angular orientation of said movable radio frequency coil with respect to said object.

22. A magnetic resonance imaging apparatus according to claim 21, further comprising:

a parking structure configured to park the radio frequency coil at a stable predetermined position in response to a predetermined driven condition of said elongated flexible member.

23. A magnetic resonance imaging apparatus according to claim 21, wherein:

the radio frequency coil drive structure is configured to allow an angle of the radio frequency coil with respect to the z-axis direction to change with a roller bearing.

24. A magnetic resonance imaging apparatus comprising:

means for generating a static homogeneous magnetic field along a z-axis direction within a three-dimensional patient imaging area extending along said z-axis and in orthogonal x and y axes;

means for acquiring MRI data from a portion of a patient within said imaging area using a radio frequency coil;

means for automatically adjusting the coil to different positions in at least the y-axis direction as different portions of the patient are moved into the imaging area;

wherein the means for automatically adjusting adjusts the coil in position so as to maintain a relatively constant volume of space between the coil and the portion of the patient from which MRI data is being acquired; and wherein the means for automatically adjusting angularly adjusts the coil in position with respect to the z-axis to accommodate changing orientation of patient body surfaces by changing the angular orientation of the coil.

* * * * *